United States Patent
Ramamurthy et al.

(10) Patent No.: US 8,743,651 B2
(45) Date of Patent: Jun. 3, 2014

(54) CLOCKED MEMORY WITH WORD LINE ACTIVATION DURING A FIRST PORTION OF THE CLOCK CYCLE

(75) Inventors: Hema Ramamurthy, Austin, TX (US); Ravindraraj Ramaraju, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 131 days.

(21) Appl. No.: 13/491,722

(22) Filed: Jun. 8, 2012

(65) Prior Publication Data

US 2013/0329512 A1 Dec. 12, 2013

(51) Int. Cl.
*G11C 8/00* (2006.01)
*G11C 8/10* (2006.01)

(52) U.S. Cl.
CPC ........................................ *G11C 8/10* (2013.01)
USPC ............ 365/230.06; 365/189.05; 365/230.01; 365/230.04; 365/230.08

(58) Field of Classification Search
CPC ........ G11C 8/10; G11C 8/12; G11C 11/4085; G11C 16/08; G11C 8/08; G11C 8/18
USPC ............. 365/230.06, 189.05, 230.01, 230.04, 365/230.08
See application file for complete search history.

(56) References Cited

U.S. PATENT DOCUMENTS

| | | | |
|---|---|---|---|
| 5,848,022 A | 12/1998 | Jiang | |
| 6,064,607 A * | 5/2000 | Miki et al. | 365/200 |
| 6,087,872 A | 7/2000 | Partovi et al. | |
| 6,181,635 B1 | 1/2001 | Bae | |
| 6,201,757 B1 | 3/2001 | Ward et al. | |
| 6,469,953 B1 | 10/2002 | Hong | |
| 6,496,038 B1 | 12/2002 | Sprague et al. | |
| 6,501,702 B2 | 12/2002 | Takagiwa et al. | |
| 6,542,006 B1 | 4/2003 | Sprague et al. | |
| 6,700,822 B1 | 3/2004 | Wang | |
| 7,545,702 B2 | 6/2009 | Kenkare et al. | |
| 2005/0116756 A1 | 6/2005 | Kim | |
| 2010/0290290 A1 | 11/2010 | Kono et al. | |

OTHER PUBLICATIONS

Ma, A., et al, "A Double-Pulsed Set-Conditional-Reset Flip-Flop", Computer Architecture, MIT-LCS-TR-844, May 1, 2002.
Kumar, R., et al., "A robust Pulsed Flipflop and its use in Enhanced Scan Design", IEEE International Conference on Computer Design, ICCD, Oct. 4-7, 2009, pp. 97-102.
U.S. Appl. No. 13/491,712, Office Action—Rejection, mailed Dec. 10, 2013.

* cited by examiner

*Primary Examiner* — Thong Q Le
(74) *Attorney, Agent, or Firm* — James L. Clingan, Jr.; Joanna G. Chiu

(57) ABSTRACT

A memory includes a plurality of latching predecoders, each including a first transistor coupled between a power supply voltage and a latch and having a control electrode coupled to a clock signal; a second transistor coupled to the first transistor and having a control electrode coupled to a first address bit signal; a third transistor coupled to the second transistor and having a control electrode coupled to a second address bit signal; a fourth transistor coupled to the third transistor and having a control electrode coupled to a delayed and inverted version of the clock signal; a fifth transistor coupled between the fourth transistor and ground and having a control electrode coupled to the clock signal; and an output which provides a predecode value during a first portion of a clock cycle of the clock signal and a predetermined logic level during a second portion of the clock cycle.

20 Claims, 5 Drawing Sheets

CLOCKED MEMORY WITH WORD LINE ACTIVATION DURING A FIRST PORTION OF THE CLOCK CYCLE

This application is related to U.S. patent application Ser. No. 13/491,712, filed on even date, titled "CLOCKED MEMORY WITH LATCHING PREDECODER CIRCUITRY," naming Hema Ramamurthy and Ravi Ramaraju and as inventors, and assigned to the current assignee hereof.

BACKGROUND

1. Field

This disclosure relates generally to memories, and more specifically, to clocked memories with clock-controlled word line activation.

2. Related Art

Word selection is in the critical path for reading or writing a memory. The word line is selected which enables memory cells along the selected word line. The enabled memory cells couple their stored state to bit lines. Sense amplifiers then respond to the bit lines in the case of a read or write drivers provide data to be written onto the bit lines in the case of a write. Thus, as the process of word line selection is made more efficient, memory operation is correspondingly made more efficient. One of the difficulties is providing reliable timing, especially in initiating the process of selecting the word line. One problem that is relevant is the combination of when to respond to an address and when to provide a decoded output. Often this is controlled by a delayed clock signal which results in the issue of waiting long enough to ensure that the signal is sufficiently developed to ensure that the signal detection is valid but not so long as to unnecessarily extend the time required to perform the detection.

Accordingly there is a need to provide word selection with circuitry that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a memory has predecoder circuitry that provides latched predecoded signals to a word line driver logic that provides the final decode that selects a word line. The predecoder circuitry is clocked so that the address combinations are resolved immediately in response to a clock and are latched early in the clock cycle. The word line is also quickly driven so that the address combinations do not need to remain latched during the whole clock cycle. The result is an efficient process for selecting and driving a word line and preparing for the next word line selection. The latching predecoders are designed to provide this function efficiently so as to provide the decoded values so that they are provided during the first portion of the clock cycle. This is better understood by reference to the drawings and the following description.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
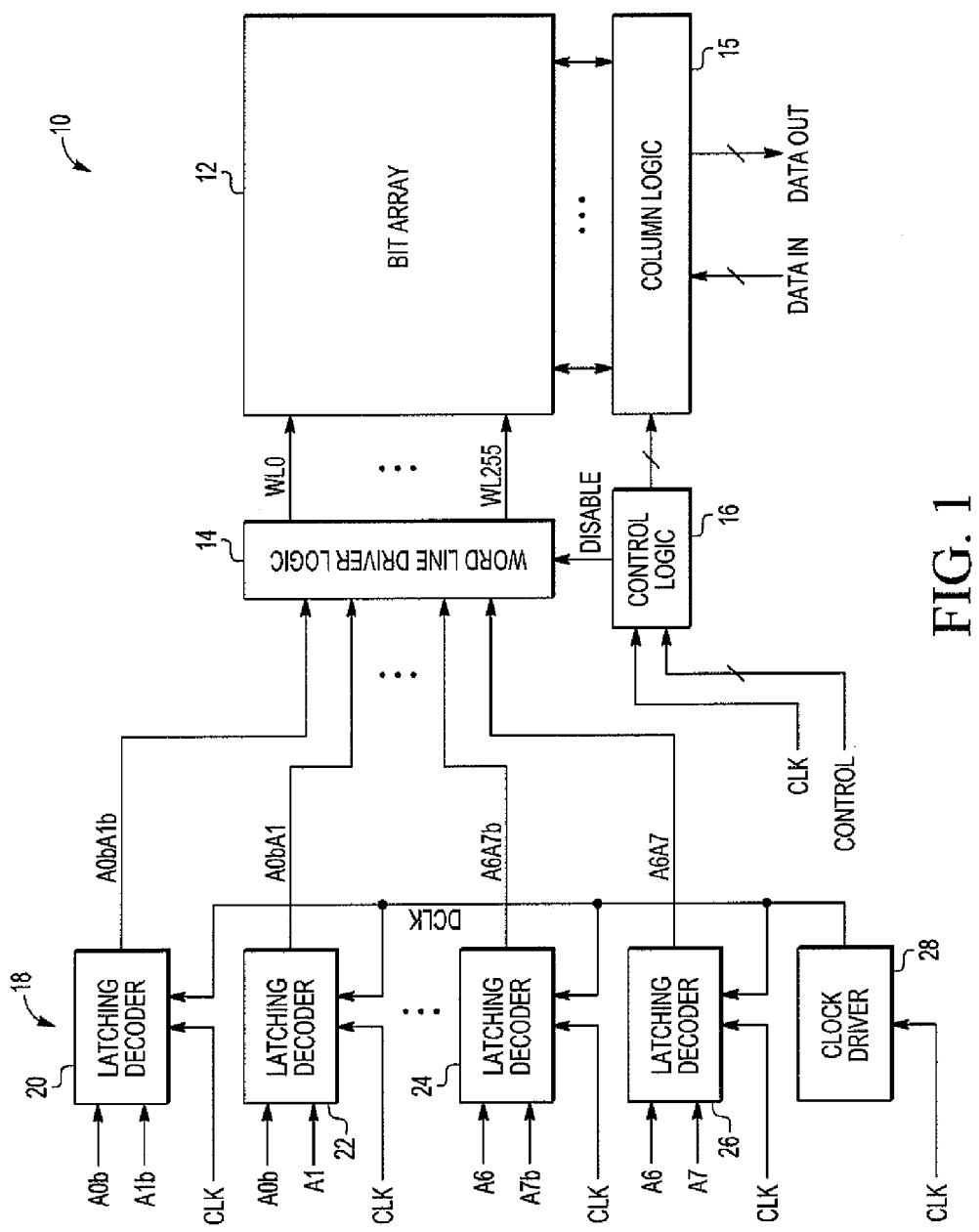
FIG. 1 is a block diagram of a memory according to an embodiment.

Shown in FIG. 1 is a memory 10 including a bit array 12, word line driver logic 14, column logic 15, control logic 16, and predecoder circuitry 18. Predecoder circuitry 18 includes a plurality of latching decoders of which latching decoders 20, 22, 24, and 26 are shown in FIG. 1. Predecoder circuitry 18 also includes a clock driver 28. In this example, the number of address bits selecting a word line are 8 so that there are 256 word lines being selected in bit array 12 and are shown as word lines WL0 through WL255. Each of the 8 addresses have a true and a complement in which the complement is identified by adding a "b" to the identifier. Thus, for the example the highest order address has address signals A0 and A0b. Similarly the next address in order has address signals A1 and A1b. The lowest order address has address signals A7 and A7b. The next to lowest order address has address signals A6 and A6b. Word line driver logic 14 is coupled to bit array 12, the latching decoders including latching decoders 20, 22, 24, and 26, and control logic 16. Column logic 15 is coupled to bit array 12 and control logic 16. Clock driver 28 receives clock signal CLK and has an output that provides delayed clock signal DCLK to latching decoders 20, 22, 24, and 26. Latching decoder 20 has inputs for receiving address signals A0b and A1b which are both a logic low if addresses A0 and A1 are a logic high. On the other hand, if addresses A0 and A1 are a logic low, then address signals A0b and A1b are a logic high. Latching decoder 20 has an output that provides a decoded signal A0bA1b as a logic high for the case of address signals A0b and A1b being a logic high which is also the case in which latching decoder 20 is selected. For the other three cases, lathing decoder 20 provides a logic low. Addresses A0 and A1 are a pair that has four combinations so that there are four latching decoders for those two addresses. Similarly, there are four latching decoders for each other pair. With four pairs, A0-A1, A2-A3, A4-A5, and A6-A7, there are a total of 16 latching decoders. Latching decoder 22 receives address signals A0b and A1 and provides decoded signal A0bA1 as an output. Latching decoder 24 receives address signals A6 and A7b and provides decoded signal A6A7b as an output. Latching decoder 26 receives address signals A6 and A7 and provides decoded signal A6A7.

Figure 2:
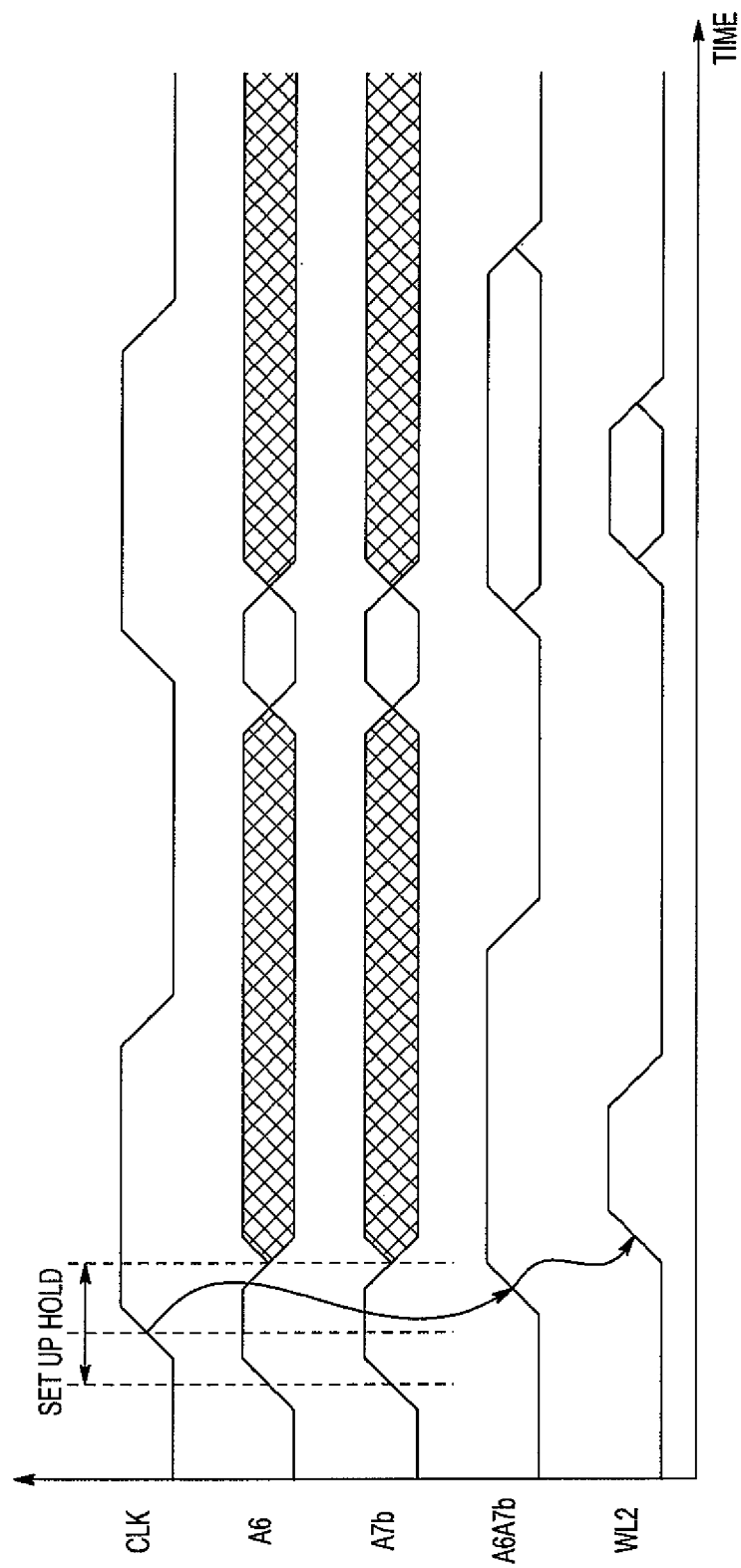
FIG. 2 is a timing diagram helpful in understanding the operation of the memory of FIG. 1.

Shown in FIG. 2 is a timing diagram showing the operation of latching decoder 24 for the case where both of its inputs are asserted as logic high. In this case address signals A6 and A7b are the address signals switching to a logic high. They must be at their intended logic state a setup time before clock signal CLK is switched to a logic high. When clock signal CLK switches to a logic high, latching decoder begins determining the logic state of determining the logic state of its output; decoded signal A6A7b. Address signals A6 and A7b must keep their logic state sufficiently long for decoded signal A6A7b to be determined and latched. This is the hold time for address signals A6 and A7b. After the hold time, the logic state of address signals A6 and A7b can change without detrimental effect. In response to decoded signals A0bA1b, A2bA3b, and A6A7b being asserted as a logic high, a word line WL2 is enabled. One decoded signal for each address pair is asserted. Thus, for each access, four decoded signals are asserted and the four together are further decoded by word line driver logic 14 to determine which particular word line is selected. In this example, word line WL2 is shown as being selected with the result of being held at a logic high long enough for the bit line or lines to receive the storage state of bit cells along the enabled word line and the consequent sensing to be achieved. Upon clock signal CLK switching back to a logic low, decoded address A6A7b is de-asserted by being brought back to a logic low. Address signals A6 and A7b are not relevant until just before the next clock cycle which would be when clock signal CLK next switches to a logic high. Address signals A6 and A7b need to be at a valid logic state the setup time before clock signal CLK switches to start the next cycle. Address signals A6 and A7b are detected by latching decoder 24 which then provides decoded signal A6A7b at the logic state that is proper based on the logic state of address signals A6 and A7b. The decoded signal A6A7b is latched and word line WL2 is either selected again or is disabled, whichever is proper based on decoded signal A6A7b and the other decoded signals. After the hold time, address signals A6 and A7b no longer need to be valid until the setup time prior to the beginning of the next cycle.

Figure 3:
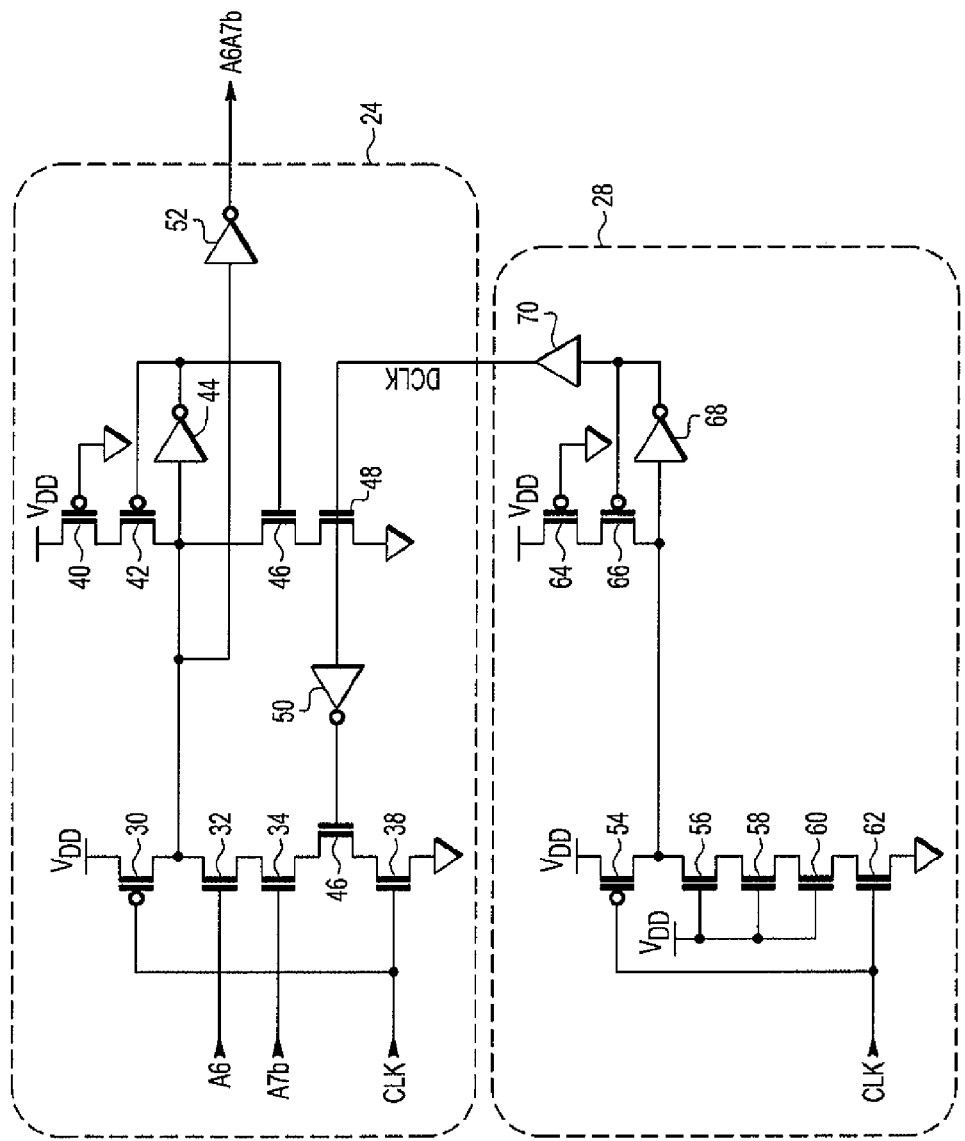
FIG. 3 is a circuit diagram of a portion of the memory of FIG. 1.

Shown in FIG. 3 is latching decoder 24 and clock driver 28 in more detail. Latching decoder 24 includes a P channel transistor 30, an N channel transistor 32, an N channel transistor 34, an N channel transistor 36, and N channel transistor 38, a P channel transistor 40, a P channel transistor 42, an inverter 44, an N channel transistor 46, an N channel transistor 48, an inverter 50, and an inverter 52. Clock driver 28 includes a P channel transistor 54, an N channel transistor 56, an N channel transistor 58, an N channel transistor 60, an N channel transistor 62, a P channel transistor 64, a P channel transistor 66, an inverter 68, and a buffer 70.

Transistor 54 has a source connected to a positive power supply terminal which may be referenced as VDD, a gate for receiving clock signal CLK, and a drain connected to an input of inverter 68. Transistor 56 has a gate connected to VDD, a drain connected to the drain of the transistor 54, and a source. Transistor 58 has a drain connected to the source of transistor 56, a gate connected to VDD, and a source. Transistor 60 has a drain connected to the source of transistor 58, a gate connected to VDD, and a source. Transistor 62 has drain connected to the source of transistor 60, a gate for receiving clock signal CLK, and a source connected to a negative power supply terminal that may be referenced as ground. Inverter 68 has an output coupled to an input of a buffer 70. Transistor 66 has a gate connected to the output of inverter 68, a drain connected to the input of inverter 68, and a source. Transistor 64 has a gate connected to ground, a source connected to VDD, and a drain connected to the source of transistor 66. Buffer 70 has an output that provided delayed clock signal DCLK.

Transistor 30 has a source connected to VDD, a gate for receiving clock signal CLK, and a drain connected to an input of inverter 44 and an input of inverter 52. Transistor 32 has a drain connected to the drain of transistor 30, a gate for receiving address signal A6, and a source. Transistor 34 has a drain connected to the source of transistor 32, a gate connected to address signal A7b, and a source. Transistor 36 has a drain connected to the source of transistor 34, a gate connected to an output of inverter 50, and a source. Transistor 38 has a drain connected to the source of transistor 36, a gate for receiving clock signal CLK, and a source connected to ground. Transistor 40 has a source connected to VDD, a gate connected to ground, and a drain. Transistor 42 has source connected to the drain of transistor 40, a gate connected to an output of inverter 44, and a drain connected to the input of inverter 44. Transistor 46 has a drain connected to the input of inverter 44, a gate connected to the output of inverter 44, and a source. Transistor 48 has a drain connected to the source of transistor 46, a gate for receiving delayed clock signal DCLK by being connected to the output of buffer 70, and a source connected to ground. An input of inverter 50 is for receiving delayed clock signal DCLK by being connected to the output of buffer 70. Inverter 52 has an output for providing decoded signal A6A7b.

In operation address signals A6 and A7b are held in a stable logic state the setup time before clock signal CLK switches to a logic high causing transistor 38 to be conductive and transistor 30 to be non-conductive. At the time prior to clock signal CLK switching to a logic high, clock signal CLK is a logic low so that transistor 62 is non-conductive and transistor 54 is a conductive. With transistor 54 being conductive, the input to inverter 68 is a logic high so that the output of inverter 68 is a logic low. Buffer 70 responds to the logic low output of inverter by providing delayed clock signal DCLK as a logic low. Inverter 50 thus has a logic low on its input so provides a logic high output to the gate of transistor 36. Transistor 36 is conductive with a logic high at its gate. Thus with transistor 36 being conductive and transistor 38 receiving a logic high at its input with clock signal CLK transitioning to a logic high, the input to inverter 44 and the input to inverter 52 will be a logic low if both of transistors 32 and 34 are conductive. Thus if both address signals A6 and A7b are a logic high, the inputs to inverters 44 and 52 will be at a logic low causing inverters 44 and 52 to provide a logic high output. Decoded signal A6A7b is provided by the output of inverter 52 so that decoded signal A6A7b is a logic high in response to clock signal CLK switching to a logic high when both address signals A6 and A7b are a logic high. With the output of inverter 44 switching to a logic high in the case of address signals being a logic high, transistor 42 becomes non-conductive and transistor 46 becomes conductive. Delayed clock signal CLK is delayed in switching to a logic high so that transistor 48 is non-conductive when transistor 46 becomes conductive but quickly becomes conductive resulting in a logic low being latched on the input of inverter 44. Because the input of inverter 44 is connected to the input of inverter 52, the output of inverter 52 is latched at a logic high independent of the logic state of address signals which completes the hold time. In the case of decoded signal A6A7b being a logic high as a response to both address signals A6 and A7b being a logic low when clock signal CLK switches to a logic high, latching decoder 24 has been selected. Decoded signal A6A7b remains a logic high until clock signal CLK switches to a logic low. When clock signal CLK switches to a logic low, transistor 30 becomes conductive and transistor 38 becomes non-conductive causing inverters 44 and 52 to provide logic low outputs so that decoded signal A6A7b becomes a logic low, transistor 42 becomes conductive and transistor 46 becomes non-conductive. This latches a logic high on the inputs of inverters 44 and 52. Delayed clock signal CLK after the delay time, switches to a logic low causing transistor 48 to be non-conductive, inverter 50 to provide a logic high low output, and transistor 36 to be non-conductive.

In the case where one or both of address signals A6 and A7b are a logic low when clock signal CLK switches to a logic high, there is no change in logic state on the inputs of inverters 44 and 52. Transistor 30 is non-conductive so is no longer providing a logic high, but the inputs to inverters 44 and 52 are held in a logic high condition due to transistor 42 and being conductive. Transistor 40 is always conductive with its source being at VDD and its gate at ground. Thus, decoded signal A6A7b remains at a logic low. Delayed clock DCLK provides a logic high to the input of inverter 50 which in turn provides a logic low output causing transistor 36 to be non-conductive by the end of the hold time. Transistor 36 being non-conductive prevents a current path to ground through transistors 32, 34, 36, and 38 after the hold time even if both address signals A6 and A7b become a logic high.

Clock driver 28 provides delayed clock signal DCLK to latch the decoded signal A6A7b when latching decoder 24 is selected which is when both address signals A6 and A7b are a logic high during the setup and hold time. Delayed clock signal DCLK is itself latched in response to clock signal CLK switching to a logic low. In such case transistor 54 is conductive and transistor 62 is non-conductive. The result then is that inverter 68 provides a logic low output to buffer 70 and transistor 66 causing buffer 70 to provide delayed clock DCLK as a logic low and transistor 66 to become conductive. With transistor 66 conductive, the logic low output of inverter 68 is reinforced. Thus, when clock signal CLK switches to a logic high, the input to inverter 68 is slower to switch to a logic low due to transistor 66 being conductive. This increases the delay in responding to a switch of clock signal CLK from a logic low to a logic high.

Figure 4:
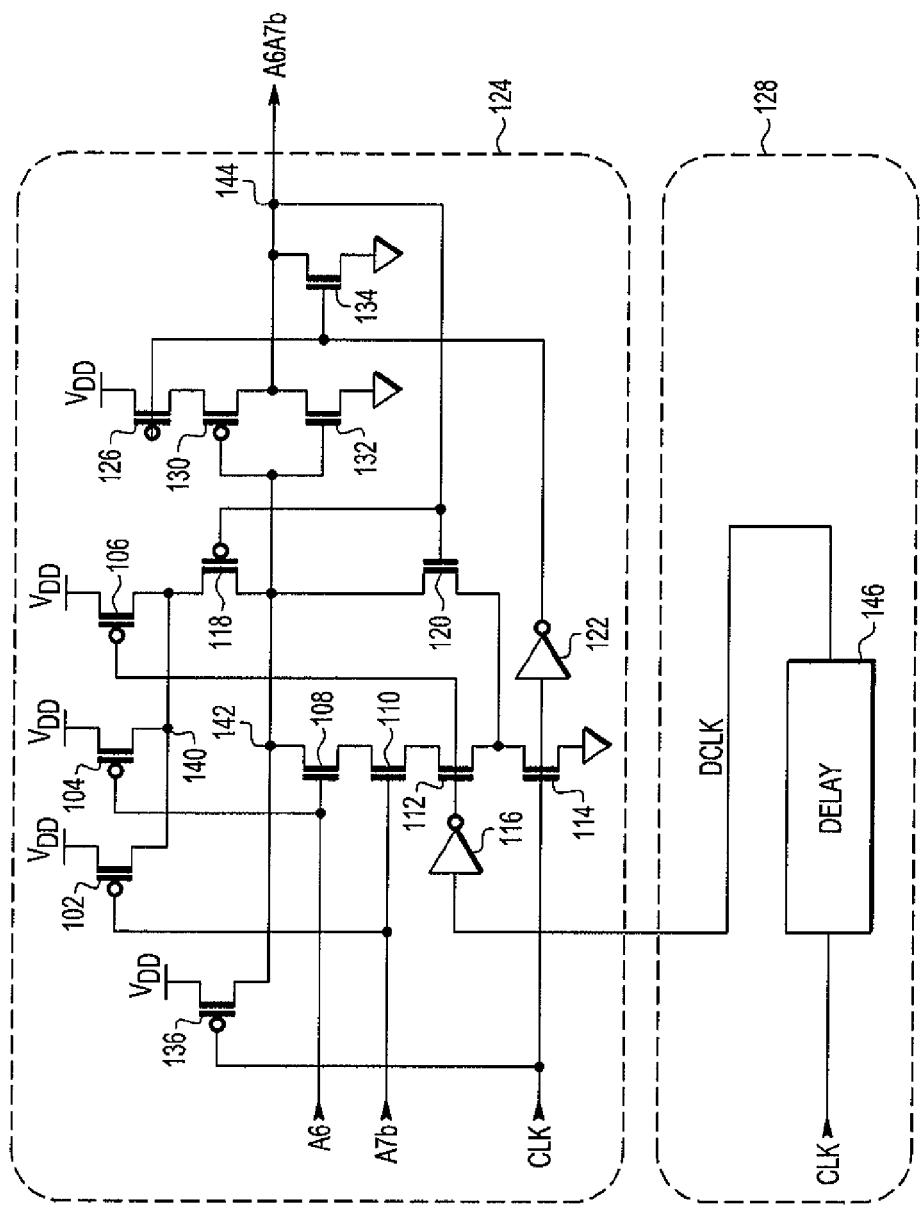
FIG. 4 is a circuit diagram of a portion of the memory of FIG. 1 as an alternative to that shown in FIG. 3.

Shown in FIG. 4 is a latching decoder 124 and a clock driver 128. Latching decoder 128 is an alternative for latching decoder 24 and is representative for replacements also for the other latching decoder such as latching decoders 20, 22, and 26 shown in FIG. 3. Similarly, clock driver 128 is an alternative for clock driver 28 shown in FIG. 3. Clock driver 128 includes a delay 146 that receives clock signal CLK and provides delayed clock signal DCLK, as shown in FIG. 1, as an output. Latching decoder 124 includes an inverter 116, an inverter 116, P channel transistors 102, 104, 106, 118, 126, 130, and 136, and N channel transistors 108, 110, 112, 114, 120, 132, and 134. Transistor 102 has a source connected to VDD, a gate for receiving address signal A7b, and a drain connected to a node 140. Transistor 104 has a source connected to VDD, a gate for receiving address signal A6, and a drain connected to node 140. Transistor 106 has a source connected to VDD, a gate connected to an output of inverter 116, and a drain connected to node 140. Transistor 108 has a drain connected to a node 142, a gate for receiving address signal A6, and a source. Transistor 110 has a drain connected to the source of transistor 108, a gate for receiving address signal A7b, and a source. Transistor 112 has a drain connected to the source of transistor 110, a gate connected to an output of inverter 116, and a source. Transistor 114 has a drain connected to the source of transistor 112, a gate for receiving clock CLK, and a source connected to ground. Transistor 118 has a 118 has a source connected to node 140, a drain connected to node 142, and a gate connected to a gate of transistor 120. The gates of transistors 118 and 120 are connected to node 144. Node 144 is where decoded address A6A7b is provided as an output of latching decoder 124. Transistor 120 has a drain connected to node 142, a gate connected to node 144, and a source connected to the drain of transistor 114. Inverter 116 has an input for receiving delayed clock signal DCLK. Inverter 122 has an input for receiving clock signal CLK and an output connected to a gate of transistor 134 and a gate of transistor 126. Transistor 126 has a source connected to VDD and a drain. Transistor 130 has a source connected to the drain of transistor 126, a gate connected to node 142, and a drain connected to node 144. Transistor 132 has a drain connected to node 144, a gate connected to node 142, and a source connected to ground. Transistor 134 has a drain connected to node 144 and a source connected to ground. Transistor 136 has a source connected to VDD, a gate for receiving clock signal CLK.

In operation, as for latching decoder 24, address signals A6 and A7b are held in a stable logic state the setup time before clock signal CLK switches to a logic high causing transistor 114 to become conductive and transistor 136 to become non-conductive. Through the inversion provided by inverter 122, transistor 134 becomes non-conductive and transistor 126 becomes conductive. Delay clock signal DCLK stays at a logic low for the duration of the delay provided by delay 146 thus, through the inversion provided by inverter 116, transistor 112 remains conductive and transistor 106 remains non-conductive for the duration of the delay. At the onset of clock signal CLK switching to a logic high, node 142 is a logic high through transistor 136 having been conductive. Node 144 is at a logic low due to transistor 132 being conductive due to the logic high on node 142 thus decoded address signal A6A7b is a logic low at the time clock CLK switches to a logic high. For the case where one or both of address signals is at a logic low when clock signal CLK switches to a logic high, node 142 remains at a logic high due to one or both of transistors 108 and 110 being non-conductive and one or both of transistors 102 and 104 being conductive. With node 142 being retained at a logic high, transistor 132 remains conductive so decoded address A6A7b, which is at node 144, remains at a logic low. After the delay time, delay clock DCLK switches to a logic high causing transistor 112, through the inversion of inverter 116, to become non-conductive and transistor 106 to become conductive. Transistor 118 is conductive because node 144 is a logic low which keeps transistor 120 non-conductive. With transistors 106 and 118 conductive and transistor 120 non-conductive, node 142 is latched at a logic high which in turn keeps node 144 and thus decoded address A6A7b at a logic low. When clock CLK switches to a logic low, transistor 136 becomes conductive and transistor 114 becomes non-conductive and, through inverter 122, transistor 134 becomes conductive and transistor 126 becomes non-conductive. Thus clock signal CLK at a logic low ensures that node 144 is at a logic low and that node 142 is at a logic high. Delay clock signal DCLK remains at a logic high for the delay duration so that transistor 112 remains non-conductive and transistor 106 remains conductive. After Delay clock signal DCLK switches to a logic low, transistor 112 becomes conductive and transistor 106 becomes non-conductive. With transistors 106 and 120 non-conductive, the latching effect of transistors 118 and 120 is disabled. The logic low on node 144 is maintained during clock signal CLK being a logic low by clock signal CLK causing transistors 136 and 134 to be conductive and transistors 126 and 114 to be non-conductive. Latching decoder is the prepared for the next cycle where clock signal CLK switches to a logic high.

For the case where both address signals A6 and A7b are a logic high at the transition of clock signal CLK to a logic high, which is the case where latching decoder 124 is selected, both transistors 108 and 110 are conductive when clock signal CLK causes transistor 114 to become conductive. With delay clock signal DCLK at a logic low, transistor 112 is conductive when transistor 114 switches to being conductive so that node 142 has a conductive path to ground through transistors 108, 110, 112, and 114 while transistors 136, 102, 104, and 106 are non-conductive so that node 142 is switched to ground. With clock signal CLK switching to a logic high, transistor 134 becomes non-conductive and transistor 126 becomes conductive. With node 142 switching to a logic low and transistor 126 conductive, transistor 130 becomes conductive and transistor 132 becomes non-conductive so that node 144, and thus decoded address A6A7b, switches to a logic high. Thus, decoded address A6A7b is switched to a logic high in response to node 142 switching to a logic low in response to transistor 114 becoming conductive. Transistor 114 remains conductive and transistor 120 becomes conductive with node 144 becoming a logic low so that node 142 is latched at a logic low. Transistor 118 is made non-conductive with node 144 at a logic low so that transistors 102, 104, and 106 are blocked from node 142. After the duration of the delay, delay clock signal DCLK switches to a logic high so that transistor 112 becomes non-conductive and transistor 106 becomes non-conductive. With transistor 112 non-conductive and node 142 latched, the logic state of address signals A6 and A7b can be changed without affecting node 142 and node 144. Thus decoded address A6A7b is latched at a logic high until clock signal CLK switches to a logic low. When clock signal CLK switches to a logic low, transistor 114 becomes non-conductive, transistor 136 becomes conductive, transistor 134 becomes conductive, and transistor 126 becomes non-conductive which causes node 142 to switch to a logic high and node 144 to switch to a logic low. The path to VDD from node 144 is blocked by transistor 126 being non-conductive. Further, transistor 132 is conductive due to node 142 being a logic high so that node 144 is held to a logic low by both transistor 134 and 132. Thus, decoded address A6A7b is ensured of being a logic low until the next occurrence of clock signal CLK switching to a logic high.

Figure 5:
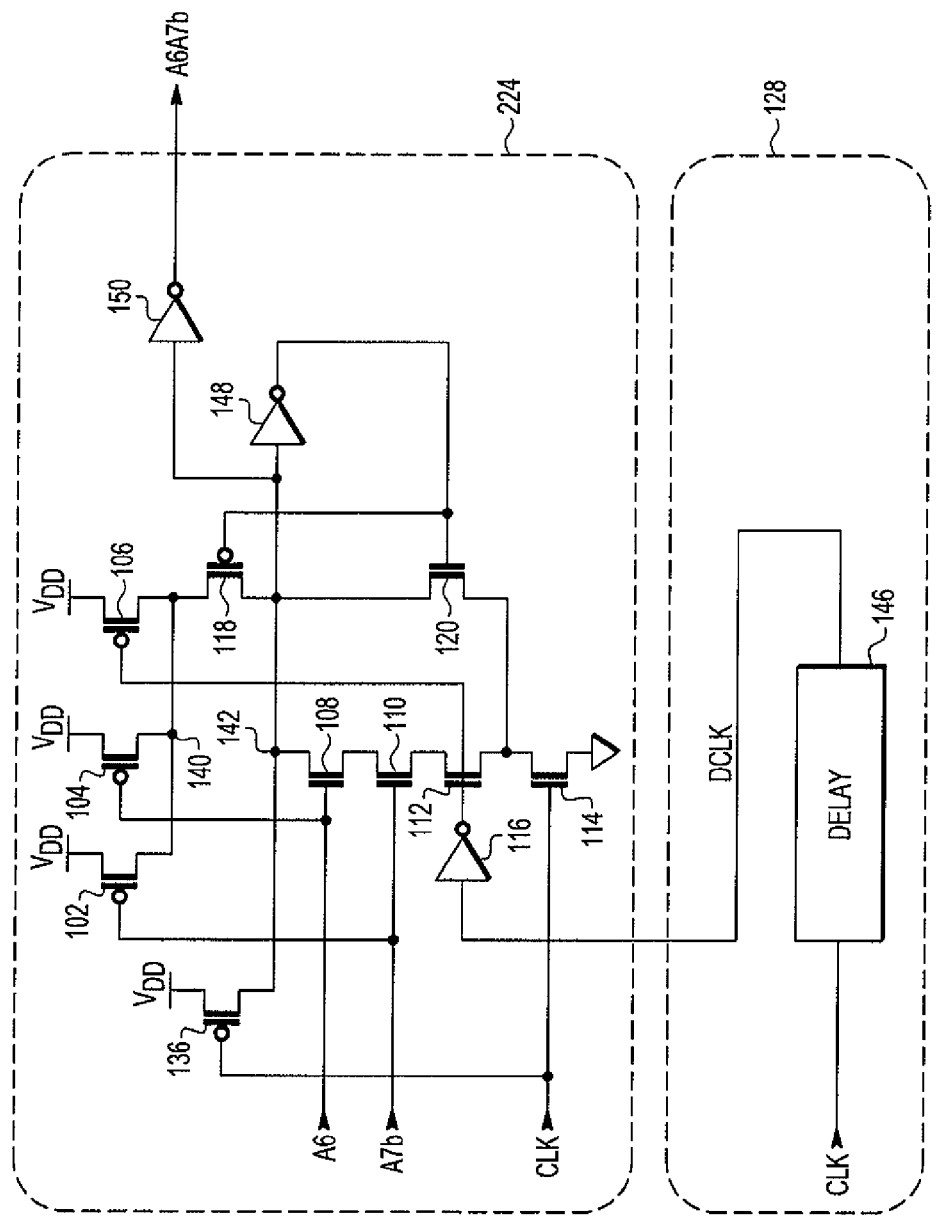
FIG. 5 is a circuit diagram of a portion of the memory of FIG. 1 as another alternative to that shown in FIG. 3.

Shown in FIG. 5 is a latching decoder 224 that is a variation on latching decoder 124 of FIG. 4 along with clock driver 128. Latching decoder 224 replaces inverter 122 and transistors 126, 130, 132, and 134 with inverters 148 and 150. The operation for the elements of the same number is the same for both latching decoder and latching decoder 124. Inverter 150 has an input connected to node 142 and an output for providing decoded address signal A6A7b. Inverter 148 has an input connected to node 142 and an output connected to the gates of transistors 118 and 120. Inverter provides an output identical to decoded address signal A6A7b but due to being part of a latch, inverter 148 has less current drive than inverter 150. Thus the effect is that the gates of transistors 118 and 120 are connected the same in latching decoder 224 as in latching decoder 124 and are part of a latch that also includes with an inverting function such as inverter 148 or transistors 126, 130, and 132. The output of inverter 150 could have its output connected to the gates of transistors 118 and 120 but would increase the capacitive load on the output of inverter 150 and thus slow down decoded address signal A6A7b. Inverter 148 latches a logic high of node 142 when transistor 106 is conductive which is when delayed clock signal DCLK switches to a logic high for the case where node 142. Inverter 148 latches a logic low when transistor 114 is conductive which is when clock signal CLK switches to a logic high when node 142 is at a logic low. These are same conditions for latching node 142 in latching decoder 124. When both addresses A6 and A7b are a logic high when clock signal CLK switches to a logic high, node 142 is switched to a logic low and latched by inverter 148 until the clock signal CLK switches back to a logic low. Inverter 150 provides decoded signal A6A7b as a logic high meaning latching decoder 124 has been selected. When either or both addresses are a logic low when clock signal CLK switches to a logic high, node 142 is a logic high which is latched when delayed clock signal DCLK switches to a logic high. Whether a logic low or a logic high on node 142 is provided in response to the address signals, the inverse is provided as decoded address signal A6A7b until the clock switches back to a logic low at which time decoded address signal A6A7b is provided at a logic low until the next time clock signal CLK switches to a logic high.

Thus, it is seen that a latching decoder performs a decode immediately in response to a new clock cycle being initiated and the subsequent result is then latched to provide sufficient time to perform a word line access based on the decoded address signal. The decoded address signal is then removed during the clock cycle so that the old decoded value has been removed prior to the new address being received. Thus, at the beginning of each clock cycle, the decoding can commence reliably without having to wait for a delayed clock signal to begin the decode.

By now it should be appreciated that there has been provided a memory including a memory array having a plurality of word lines. The memory further includes a plurality of latching predecoders. Each predecoder includes a latch. Each predecoder further includes a first transistor of a first conductivity type having a first current electrode coupled to a power supply voltage, a second current electrode coupled to the latch, and a control electrode coupled to a clock signal. Each predecoder further includes a second transistor of a second conductivity type, opposite the first conductivity type, having a first current electrode coupled to the second current electrode of the first transistor, a second current electrode, and a control electrode coupled to a first address bit signal. Each predecoder further includes a third transistor of the second conductivity type having a first current electrode coupled to the second current electrode of the second transistor, a second current electrode, and a control electrode coupled to a second address bit signal. Each predecoder further includes a fourth transistor of the second conductivity type having a first current electrode coupled to the second current electrode of the third transistor, a control electrode coupled to a delayed and inverted version of the clock signal, and a second current electrode. Each predecoder further includes a fifth transistor of the second conductivity type having a first current electrode coupled to the second current electrode of the fourth transistor, a control electrode coupled to the clock signal, and a second current electrode coupled to ground. Each predecoder further includes an output, wherein the output provides a predecode value corresponding to a latched value in the latch during a first portion of a clock cycle of the clock signal and a predetermined logic level during a second portion of the clock cycle of the clock signal, wherein the predecode value represents a logic function of the first and second address bit signals. The memory further includes word line driver logic coupled between the plurality of latching predecoders and the memory array, wherein the word line driver logic activates a selected word line of the plurality of word lines based on the predecode values provided by the plurality of latching predecoders during the first portion of the clock cycle. The memory may have a further characterization by which the memory is configured to receive N address bit signals to access a location within the memory array, and wherein, for each of the latching predecoders, the first address bit signal is one of the N address bit signals or a complement of the one of the N address bit signals, and the second address bit signals is another one of the N address bit signals of a complement of the another one of the N address bit signals. The memory may have a further characterization by which each of the latching predecoders uses a unique combination of address bit signals for the first address bit signal and the second address bit signal. The memory may have a further characterization by which for each of the plurality of latching predecoders, the predecode value provided during the first portion of the clock cycle represents an AND operation of the first address bit signal and the second address bit signal.

Described also is a memory having a memory array having a plurality of word lines. The memory further includes a plurality of latching predecoders. Each predecoder includes a first transistor of a first conductivity type having a first current electrode coupled to a power supply voltage, a second current electrode coupled to a circuit node, and a control electrode coupled to a clock signal. Each predecoder further includes a second transistor of a second conductivity type, opposite the first conductivity type, having a first current electrode coupled to the second current electrode of the first transistor, a second current electrode, and a control electrode coupled to a first address bit signal. Each predecoder further includes a third transistor of the second conductivity type having a first current electrode coupled to the second current electrode of the second transistor, a second current electrode, and a control electrode coupled to a second address bit signal. Each predecoder further includes a fourth transistor of the second conductivity type having a first current electrode coupled to the second current electrode of the third transistor, a control electrode coupled to a delayed and inverted version of the clock signal, and a second current electrode. Each predecoder further includes a fifth transistor of the second conductivity type having a first current electrode coupled to the second current electrode of the fourth transistor, a control electrode coupled to the clock signal, and a second current electrode coupled to ground. Each predecoder further includes a sixth transistor of the first conductivity type having a first current electrode coupled to the power supply voltage, a control electrode, and a second current electrode coupled to the circuit node. Each predecoder further includes a seventh transistor of the second conductivity type having a first current electrode coupled to the circuit node, a control electrode coupled to the control electrode of the sixth transistor, and a second current electrode. Each predecoder further includes a first inverter having an input coupled to the circuit node and an output coupled to the control electrodes of the sixth and seventh transistors. Each predecoder further includes an eighth transistor having a first current electrode coupled to the second current electrode of the seventh transistor, a control electrode coupled to a delayed version of the clock signal, and a second current electrode coupled to ground. Each predecoder further includes a second inverter having an input coupled to the circuit node, and an output. The memory further includes word line driver logic coupled to the output of the second inverter of each of the plurality of latching predecoders and to the plurality of word lines of the memory array. The memory may have a further characterization by which the memory is configured to receive N address bit signals to access a location within the memory array, and wherein, for each of the latching predecoders, the first address bit signal is one of the N address bit signals or a complement of the one of the N address bit signals, and the second address bit signals is another one of the N address bit signals of a complement of the another one of the N address bit signals, and wherein each of the latching predecoders uses a unique combination of address bit signals for the first address bit signal and the second address bit signal.

Described also is a memory including a memory array having a plurality of word lines. The memory further includes a plurality of latching predecoders. Each latching predecoder includes a first transistor of a first conductivity type having a first current electrode coupled to a power supply voltage, a second current electrode coupled to a first circuit node, and a control electrode coupled to a clock signal. Each latching predecoder further includes a second transistor of a second conductivity type, opposite the first conductivity type, having a first current electrode coupled to the second current electrode of the first transistor, a second current electrode, and a control electrode coupled to a first address bit signal. Each latching predecoder further includes a third transistor of the second conductivity type having a first current electrode coupled to the second current electrode of the second transistor, a second current electrode, and a control electrode coupled to a second address bit signal. Each latching predecoder further includes a fourth transistor of the second conductivity type having a first current electrode coupled to the second current electrode of the third transistor, a control electrode coupled to a delayed and inverted version of the clock signal, and a second current electrode. Each latching predecoder further includes a fifth transistor of the second conductivity type having a first current electrode coupled to the second current electrode of the fourth transistor, a control electrode coupled to the clock signal, and a second current electrode coupled to ground. Each latching predecoder further includes a sixth transistor of the first conductivity type having a first current electrode coupled to the power supply voltage, a control electrode coupled to the second address bit signal, and a second current electrode coupled to a second circuit node. Each latching predecoder further includes a seventh transistor of the first conductivity type having a first current electrode coupled to the power supply voltage, a control electrode coupled to the second address bit signal, and a second current electrode coupled to the second circuit node. Each latching predecoder further includes an eighth transistor of the first conductivity type having a first current electrode coupled to the power supply voltage, a control electrode coupled to the delayed and inverted version of the clock, and a second current electrode coupled to the second circuit node. Each latching predecoder further includes a ninth transistor having a first current electrode coupled to the second circuit node, a control electrode, and a second current electrode coupled to the first circuit node. Each latching predecoder further includes a tenth transistor having a first current electrode coupled to the first circuit node, a control electrode coupled to the control electrode of the ninth transistor, and a second current electrode coupled to the first current electrode of the fifth transistor. Each latching predecoder further includes a first inverter having an input coupled to the first circuit node and an output coupled to the control electrodes of the ninth and tenth transistors. Each latching predecoder further includes a second inverter having an input coupled to the first circuit node, and an output. The memory further includes word line driver logic coupled to the output of the second inverter of each of the plurality of latching predecoders and to the plurality of the word lines of the memory array. The memory may have a further characterization by which each of the outputs of the second inverters simultaneously provides a predecode value in response to a rising edge of the clock signal and simultaneously provides a logic level low in response to a falling edge of the clock signal, wherein the word line driver logic activates a selected word line of the plurality of word lines based on the predecode values when the outputs of the second inverters provide the predecode values and the word line driver activates no word lines of the plurality of word lines when all the outputs of the second inverters provide the logic level low.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciate that conductivity types and polarities of potentials may be reversed.

Although the invention is described herein with reference to specific embodiments, various modifications and changes can be made without departing from the scope of the present invention as set forth in the claims below. For example, the number of word lines or address signals can vary. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory comprising:
    a memory array having a plurality of word lines;
    a plurality of latching predecoders, wherein each of the latching predecoders comprises:
        a latch;
        a first transistor of a first conductivity type having a first current electrode coupled to a power supply voltage, a second current electrode coupled to the latch, and a control electrode coupled to a clock signal;
        a second transistor of a second conductivity type, opposite the first conductivity type, having a first current electrode coupled to the second current electrode of the first transistor, a second current electrode, and a control electrode coupled to a first address bit signal;
        a third transistor of the second conductivity type having a first current electrode coupled to the second current electrode of the second transistor, a second current electrode, and a control electrode coupled to a second address bit signal;
        a fourth transistor of the second conductivity type having a first current electrode coupled to the second current electrode of the third transistor, a control electrode coupled to a delayed and inverted version of the clock signal, and a second current electrode;
        a fifth transistor of the second conductivity type having a first current electrode coupled to the second current electrode of the fourth transistor, a control electrode coupled to the clock signal, and a second current electrode coupled to ground; and
        an output, wherein the output provides a predecode value corresponding to a latched value in the latch during a first portion of a clock cycle of the clock signal and a predetermined logic level during a second portion of the clock cycle of the clock signal, wherein the predecode value represents a logic function of the first and second address bit signals; and
    word line driver logic coupled between the plurality of latching predecoders and the memory array, wherein the word line driver logic activates a selected word line of the plurality of word lines based on the predecode values provided by the plurality of latching predecoders during the first portion of the clock cycle.

2. The memory of claim 1, wherein the memory is configured to receive N address bit signals to access a location within the memory array, and wherein, for each of the latching predecoders, the first address bit signal is one of the N address bit signals or a complement of the one of the N address bit signals, and the second address bit signals is another one of the N address bit signals of a complement of the another one of the N address bit signals.

3. The memory of claim 2, wherein each of the latching predecoders uses a unique combination of address bit signals for the first address bit signal and the second address bit signal.

4. The memory of claim 3, wherein, for each of the plurality of latching predecoders, the predecode value provided during the first portion of the clock cycle represents an AND operation of the first address bit signal and the second address bit signal.

5. The memory of claim 3, wherein the predetermined logic level is a logic level zero, and wherein, during the second portion of the clock cycle, every latching predecoder of the plurality of latching predecoders simultaneously provides the logic level zero.

6. The memory of claim 1, wherein, for each of the latching predecoders, the latch latches the latched value in response to a rising edge of the clock signal and the logic level zero is provided in response to a falling edge of the clock signal.

7. The memory of claim 1, wherein within each of the latching predecoders, the latch comprises:
    a sixth transistor of the first conductivity type having a first current electrode coupled to the power supply voltage, a control electrode, and a second current electrode coupled to the second current electrode of the first transistor;
    a seventh transistor of the second conductivity type having a first current electrode coupled to the second current electrodes of the first and sixth transistors, a control electrode, and a second current electrode; and
    an inverter having an input coupled to second current electrodes of the first and sixth transistors, and an output coupled to the control electrodes of the sixth and seventh transistors.

8. The memory of claim 7, wherein each of the latching predecoders further comprises:
    an eighth transistor of the second conductivity type having a first current electrode coupled to the second current electrode of the seventh transistor, a second current electrode coupled to ground, and a control electrode coupled to a delayed version of the clock signal; and
    an inverter having an input coupled to the delayed version of the clock signal and an output coupled to the control electrode of the fourth transistor.

9. The memory of claim 8, further comprising:
    a clock driver circuit which receives the clock signal and provides the delayed version of the clock signal to each of the plurality of latching predecoders, wherein each of the latching predecoders latches the latched value at a predetermined delay after occurrence of a rising edge of the clock signal, wherein the predetermined delay is at least partially provided by the clock driver circuit.

10. The memory of claim 9, wherein the clock driver circuit comprises:
a tracking inverter which receives the clock signal and tracks timing of the first, second, third, fourth, and fifth transistors in each latching predecoder; and
a tracking latch which tracks timing of the latch in each latching predecoder.

11. The memory of claim 1, wherein each of the latching predecoders comprises:
a sixth transistor of the first conductivity type having a first current electrode coupled to the power supply voltage, a control electrode coupled to the second address bit signal, and a second current electrode coupled to the latch;
a seventh transistor of the first conductivity type having a first current electrode coupled to the power supply voltage, a control electrode coupled to the first address bit signal, and a second current electrode coupled to the second current electrode of the sixth transistor; and
an eighth transistor of the first conductivity type having a first current electrode coupled to the power supply voltage, a control electrode coupled to the delayed and inverted version of the clock signal, and a second current electrode coupled to the second current electrode of the sixth transistor.

12. The memory of claim 11, wherein within each of the latching predecoders, the latch comprises:
a ninth transistor of the first conductivity type having a first current electrode coupled to the control electrode of the sixth transistor, a control electrode, and a second current electrode coupled to the second current electrode of the first transistor;
a tenth transistor of the second conductivity type having a first current electrode coupled to the second current electrodes of the first and ninth transistors, a control electrode coupled to the control electrode of the ninth transistor, and a second current electrode coupled to the first current electrode of the fifth transistor; and
an inverter having an input coupled to second current electrodes of the first and ninth transistors, and an output coupled to the control electrode of the tenth transistor.

13. The memory of claim 11, wherein within each of the latching predecoders, the latch comprises:
a ninth transistor of the first conductivity type having a first current electrode coupled to the second control electrode of the sixth transistor, a control electrode, and a second current electrode coupled to the second current electrode of the first transistor;
a tenth transistor of the second conductivity type having a first current electrode coupled to the second current electrodes of the first and ninth transistors, a control electrode coupled to the control electrode of the ninth transistor, and a second current electrode coupled to the first current electrode of the fifth transistor;
an eleventh transistor of the first conductivity type having a first current electrode coupled to the power supply voltage, a control electrode coupled to an inverted version of the clock signal, and a second current electrode;
a twelfth transistor of the first conductivity type having a first current electrode coupled to the second current electrode of the eleventh transistor, a control electrode coupled to the second current electrodes of the first and ninth transistors, and a second current electrode;
a thirteenth transistor of the second conductivity type having a first current electrode connected to the second current electrode of the twelfth transistor, a control electrode coupled to the control electrode of the twelfth transistor, and a second current electrode coupled to ground; and
a fourteenth transistor of the second conductivity type having a first current electrode coupled to the second current electrode of the twelfth transistor and the control electrode of the tenth transistor, a control electrode coupled to the inverted version of the clock signal, and a second current electrode coupled to ground.

14. A memory comprising:
a memory array having a plurality of word lines;
a plurality of latching predecoders, wherein each of the latching predecoders comprises:
a first transistor of a first conductivity type having a first current electrode coupled to a power supply voltage, a second current electrode coupled to a circuit node, and a control electrode coupled to a clock signal;
a second transistor of a second conductivity type, opposite the first conductivity type, having a first current electrode coupled to the second current electrode of the first transistor, a second current electrode, and a control electrode coupled to a first address bit signal;
a third transistor of the second conductivity type having a first current electrode coupled to the second current electrode of the second transistor, a second current electrode, and a control electrode coupled to a second address bit signal;
a fourth transistor of the second conductivity type having a first current electrode coupled to the second current electrode of the third transistor, a control electrode coupled to a delayed and inverted version of the clock signal, and a second current electrode;
a fifth transistor of the second conductivity type having a first current electrode coupled to the second current electrode of the fourth transistor, a control electrode coupled to the clock signal, and a second current electrode coupled to ground;
a sixth transistor of the first conductivity type having a first current electrode coupled to the power supply voltage, a control electrode, and a second current electrode coupled to the circuit node;
a seventh transistor of the second conductivity type having a first current electrode coupled to the circuit node, a control electrode coupled to the control electrode of the sixth transistor, and a second current electrode;
a first inverter having an input coupled to the circuit node and an output coupled to the control electrodes of the sixth and seventh transistors;
an eighth transistor having a first current electrode coupled to the second current electrode of the seventh transistor, a control electrode coupled to a delayed version of the clock signal, and a second current electrode coupled to ground; and
a second inverter having an input coupled to the circuit node, and an output; and
word line driver logic coupled to the output of the second inverter of each of the plurality of latching predecoders and to the plurality of word lines of the memory array.

15. The memory of claim 14, wherein each of the outputs of the second inverters simultaneously provides a predecode value in response to a rising edge of the clock signal and simultaneously provides a logic level low in response to a falling edge of the clock signal.

16. The memory of claim 15, wherein the word line driver logic activates a selected word line of the plurality of word lines based on the predecode values when the outputs of the second inverters provide the predecode values and the word line driver activates no word lines of the plurality of word lines when all the outputs of the second inverters provide the logic level low.

17. The memory of claim 14, wherein the memory is configured to receive N address bit signals to access a location within the memory array, and wherein, for each of the latching predecoders, the first address bit signal is one of the N address bit signals or a complement of the one of the N address bit signals, and the second address bit signals is another one of the N address bit signals of a complement of the another one of the N address bit signals, and wherein each of the latching predecoders uses a unique combination of address bit signals for the first address bit signal and the second address bit signal.

18. A memory comprising:
a memory array having a plurality of word lines;
a plurality of latching predecoders, wherein each of the latching predecoders comprises:
  a first transistor of a first conductivity type having a first current electrode coupled to a power supply voltage, a second current electrode coupled to a first circuit node, and a control electrode coupled to a clock signal;
  a second transistor of a second conductivity type, opposite the first conductivity type, having a first current electrode coupled to the second current electrode of the first transistor, a second current electrode, and a control electrode coupled to a first address bit signal;
  a third transistor of the second conductivity type having a first current electrode coupled to the second current electrode of the second transistor, a second current electrode, and a control electrode coupled to a second address bit signal;
  a fourth transistor of the second conductivity type having a first current electrode coupled to the second current electrode of the third transistor, a control electrode coupled to a delayed and inverted version of the clock signal, and a second current electrode;
  a fifth transistor of the second conductivity type having a first current electrode coupled to the second current electrode of the fourth transistor, a control electrode coupled to the clock signal, and a second current electrode coupled to ground;
  a sixth transistor of the first conductivity type having a first current electrode coupled to the power supply voltage, a control electrode coupled to the second address bit signal, and a second current electrode coupled to a second circuit node;
  a seventh transistor of the first conductivity type having a first current electrode coupled to the power supply voltage, a control electrode coupled to the second address bit signal, and a second current electrode coupled to the second circuit node;
  an eighth transistor of the first conductivity type having a first current electrode coupled to the power supply voltage, a control electrode coupled to the delayed and inverted version of the clock, and a second current electrode coupled to the second circuit node;
  a ninth transistor having a first current electrode coupled to the second circuit node, a control electrode, and a second current electrode coupled to the first circuit node;
  a tenth transistor having a first current electrode coupled to the first circuit node, a control electrode coupled to the control electrode of the ninth transistor, and a second current electrode coupled to the first current electrode of the fifth transistor;
  a first inverter having an input coupled to the first circuit node and an output coupled to the control electrodes of the ninth and tenth transistors; and
  a second inverter having an input coupled to the first circuit node, and an output; and
word line driver logic coupled to the output of the second inverter of each of the plurality of latching predecoders and to the plurality of the word lines of the memory array.

19. The memory of claim 18, wherein each of the outputs of the second inverters simultaneously provides a predecode value in response to a rising edge of the clock signal and simultaneously provides a logic level low in response to a falling edge of the clock signal, wherein the word line driver logic activates a selected word line of the plurality of word lines based on the predecode values when the outputs of the second inverters provide the predecode values and the word line driver activates no word lines of the plurality of word lines when all the outputs of the second inverters provide the logic level low.

20. The memory of claim 18, wherein the memory is configured to receive N address bit signals to access a location within the memory array, and wherein, for each of the latching predecoders, the first address bit signal is one of the N address bit signals or a complement of the one of the N address bit signals, and the second address bit signals is another one of the N address bit signals of a complement of the another one of the N address bit signals, and wherein each of the latching predecoders uses a unique combination of address bit signals for the first address bit signal and the second address bit signal.

* * * * *